United States Patent
Beliveau et al.

(10) Patent No.: US 10,782,794 B2
(45) Date of Patent: Sep. 22, 2020

(54) HAPTIC OPERATING ELEMENT FOR A HOUSEHOLD APPLIANCE

(71) Applicant: BSH HAUSGERAETE GMBH, Munich (DE)

(72) Inventors: Thomas Eric Beliveau, Munich (DE); Tobias Schmidt, Munich (DE)

(73) Assignee: BSH Hausgeraete GmbH, Munich (DE)

( * ) Notice: Subject to any disclaimer, the term of this patent is extended or adjusted under 35 U.S.C. 154(b) by 0 days.

(21) Appl. No.: 16/463,395

(22) PCT Filed: Nov. 15, 2017

(86) PCT No.: PCT/EP2017/079265
§ 371 (c)(1),
(2) Date: May 23, 2019

(87) PCT Pub. No.: WO2018/095773
PCT Pub. Date: May 31, 2018

(65) Prior Publication Data
US 2019/0354195 A1    Nov. 21, 2019

(30) Foreign Application Priority Data

Nov. 25, 2016    (DE) .......................... 10 2016 223 476

(51) Int. Cl.
*G06F 3/02*     (2006.01)
*F24F 11/89*    (2018.01)
*F24C 7/08*     (2006.01)
*G06F 3/041*    (2006.01)

(52) U.S. Cl.
CPC ................ *G06F 3/02* (2013.01); *F24C 7/083* (2013.01); *F24F 11/89* (2018.01); *G06F 3/0416* (2013.01)

(58) Field of Classification Search
CPC ..... F16B 7/182; F16M 11/36; F16M 2200/08; G03B 17/561
USPC .......................................... 345/156, 170–178
See application file for complete search history.

(56) References Cited

U.S. PATENT DOCUMENTS

| | | | | |
|---|---|---|---|---|
| 6,813,524 | B2 * | 11/2004 | Peterson | D06F 34/28 700/13 |
| 8,451,248 | B1 * | 5/2013 | Kim | G06F 3/016 345/173 |
| 2004/0095369 | A1 * | 5/2004 | Takeuchi | G06F 3/016 715/701 |

(Continued)

FOREIGN PATENT DOCUMENTS

| | | |
|---|---|---|
| CN | 101974840 A | 2/2011 |
| CN | 104423747 A | 3/2015 |

(Continued)

*Primary Examiner* — Tony O Davis
(74) *Attorney, Agent, or Firm* — Laurence A. Greenberg; Werner H. Stemer; Ralph E. Locher

(57) ABSTRACT

A haptic operating element for a household appliance includes a display field which is at least partially configured as a touch-sensitive screen. The household appliance includes at least one haptic operating element and an additional screen fixed relative to the device. The household appliance has, in particular, a control device for operating the display field of the operating element and the screen fixed relative to the device. The haptic operating element can be particularly advantageously used in cooking devices.

7 Claims, 2 Drawing Sheets

(56) References Cited

U.S. PATENT DOCUMENTS

| | | | |
|---|---|---|---|
| 2004/0178192 A1* | 9/2004 | Muegge | F24C 15/325 219/681 |
| 2004/0207607 A1 | 10/2004 | Specks et al. | |
| 2005/0236390 A1 | 10/2005 | Gama et al. | |
| 2007/0024486 A1 | 2/2007 | McRae | |
| 2010/0103137 A1* | 4/2010 | Ciesla | G06F 3/0202 345/174 |
| 2011/0102145 A1* | 5/2011 | Park | G06F 3/016 340/6.1 |
| 2011/0148793 A1* | 6/2011 | Ciesla | G06F 3/0202 345/173 |
| 2012/0084467 A1* | 4/2012 | Birnbaum | G06F 3/016 710/16 |
| 2012/0200529 A1* | 8/2012 | Ciesla | G06F 3/0202 345/174 |
| 2012/0223914 A1* | 9/2012 | Ciesla | G06F 3/0202 345/174 |
| 2012/0235935 A1* | 9/2012 | Ciesla | G06F 3/0202 345/173 |
| 2012/0306787 A1* | 12/2012 | Ciesla | G06F 3/0202 345/173 |
| 2014/0092037 A1* | 4/2014 | Kim | G06F 3/041 345/173 |
| 2014/0095994 A1* | 4/2014 | Kim | G06F 3/013 715/702 |
| 2014/0160064 A1* | 6/2014 | Yairi | G06F 3/04883 345/174 |
| 2014/0317501 A1* | 10/2014 | Brasseur | G06F 8/65 715/702 |
| 2014/0358250 A1* | 12/2014 | Crohas | G06F 3/038 700/3 |
| 2015/0029123 A1* | 1/2015 | Ciesla | G06F 3/04886 345/173 |
| 2015/0199012 A1* | 7/2015 | Palmer | G06F 3/016 345/184 |
| 2016/0256009 A1* | 9/2016 | Planegger | A47J 43/082 |
| 2017/0019978 A1* | 1/2017 | Lashina | H03K 17/962 |
| 2017/0024054 A1* | 1/2017 | Yairi | G06F 3/016 |
| 2017/0163437 A1 | 6/2017 | Yang et al. | |
| 2017/0242573 A1 | 8/2017 | Goss et al. | |
| 2019/0193652 A1* | 6/2019 | Unveren | B60Q 9/00 |

FOREIGN PATENT DOCUMENTS

| | | |
|---|---|---|
| CN | 104487624 A | 4/2015 |
| DE | 19817195 C1 | 9/1999 |
| DE | 102006026187 A1 | 12/2007 |
| DE | 102010062745 A1 | 6/2012 |
| DE | 102014216414 A1 | 2/2016 |
| DE | 102014223371 A1 | 5/2016 |
| EP | 0950860 B1 | 12/2004 |
| EP | 1893919 A1 | 3/2008 |
| EP | 2466208 A1 | 6/2012 |
| WO | 2006133976 A1 | 12/2006 |
| WO | 2008003572 A2 | 1/2008 |
| WO | 2016010231 A1 | 1/2016 |

\* cited by examiner

HAPTIC OPERATING ELEMENT FOR A HOUSEHOLD APPLIANCE

BACKGROUND OF THE INVENTION

Field of the Invention

The invention relates to a haptic operating element for a household appliance, the operating element having a display field. The invention also relates to a household appliance with such a haptic operating element and a further screen fixed relative to the appliance. The invention can be used particularly advantageously for cooking appliances.

DE 10 2014 216 414 A1 discloses an operating apparatus for a household appliance, with a first display field and a rotatable operating element, the display field being configured in a touch-sensitive manner and it being possible to select at least two different functions of the household appliance by touching the display field in a display region associated with the respective function, the operating element having a display region and a display on the display region being linked to the function selected by way of the display field and it being possible to change a parameter of the selected function by actuating the operating element and a parameter value set by this means being displayed on the display region of the operating element. DE 10 2014 216 414 A1 also discloses a household appliance. This has the disadvantage that the user must still frequently switch the focus of his/her attention between the rotary knob and the display field when operating the household appliance.

SUMMARY OF THE INVENTION

It is the object of the present invention to eliminate the disadvantages of the prior art at least partially and in particular to make it possible to improve the operability of a household appliance with a display field and a haptic operating element.

This object is achieved according to the features of the independent claims. Preferred embodiments will emerge from the dependent claims in particular.

The object is achieved by a haptic operating element for a household appliance, said operating element having a display field, characterized in that the display field is configured at least partially as a touch-sensitive screen.

This operating element has the advantage that a user no longer has to divert his/her attention away from the haptic operating element to actuate or activate a setting selected by the haptic operating element, in order to operate the household appliance. The screen here allows a context-related display. Confirmation or activation is achieved by touching the touch-sensitive part (specifically the touch-sensitive screen) of the display field. This generally allows particularly clearly structured, focused and context-related appliance operation, resulting in improved operability.

A haptic operating element refers in particular to an operating element that a user can take hold of for its operation. The haptic operating element can be a component of the household appliance. The operating element can then be considered to be a household appliance operating element.

The touch-sensitive screen can also be referred to as a sensor screen or touchscreen. It can be a capacitive sensing screen for example. The touch-sensitive screen is in particular a pixel-type screen. The touch-sensitive screen can be a monochrome (e.g. black and white) or color screen.

In one development the entire display field is configured as a touch-sensitive screen. This provides a particularly large and versatile touch-sensitive surface. In an alternative development part of the display field is configured as at least one touch-sensitive screen and a remaining part of the display field is configured as a screen that is not touch-sensitive. This is a particularly economical model.

The haptic operating element can essentially be an operating element that is connected in a fixed manner to the household appliance. In an alternative embodiment the operating element is an operating element that can be removed from the (remainder of the) household appliance. This improves child safety and makes it easier to clean and operate due to the variable selection of its positioning point. The operating element can be provided for example to be positioned on an operating panel of the household appliance in a detachable manner.

If the operating element is a removable operating element in particular, it can have a data interface with the household appliance in order to exchange data with the household appliance. The operating element can be an operating element that can be fastened magnetically to the (remainder of the) household appliance. The data interface is advantageously a wireless data interface, for example a close-range radio interface, e.g. in the form of a Bluetooth module, ZigBee module, etc. Alternatively or additionally the removable operating element can have at least one coil for transformation-based data transmission as the data interface. The coil also allows energy to be supplied to the removable operating element by induction or transformation.

In one development the haptic operating element has the display field on its front face facing a user. This provides particularly good visibility and a large display surface. The haptic operating element can also have at least one display field on its edge surface. The front face can correspond to a flat or slightly curved front face of a button-shaped or cylindrical operating element. The display field can then be circular or ring-shaped in particular.

In one development practically the entire touchable front face of the operating element is configured as a display field, in some instances with a narrow edge.

In another embodiment the operating element is a rotary knob, in particular a removable rotary knob. This allows particularly simple intuitive and also efficient operation of the household appliance. It has the further advantage that two modes of operation that are clearly separate in respect of operation but are visually associated can be performed using a single operating element, specifically rotation of the rotary knob using its lateral surface and pressing the front face.

In a further embodiment the operating element has a data processing unit for exchanging data with the household appliance and for operating its screen. As a result the operating element can be operated even when there is a small quantity of data to transfer. The household appliance can be spared the output for operating the screen directly.

The object is also achieved by a household appliance, having at least one haptic operating element as described above and in particular a further screen fixed relative to the appliance. The household appliance has the same advantages as the haptic operating element. The haptic operating element can be considered to be a component of the household appliance.

The household appliance can be an electrically operated household appliance. The household appliance can be a kitchen appliance. The household appliance can be a cooking appliance, a laundry treatment appliance or a refrigeration appliance, for example. The cooking appliance can be an oven or can have an oven (e.g. a cooker).

A screen fixed relative to the appliance is a screen which is attached in a fixed manner to the household appliance. The screen fixed relative to the appliance can be arranged in particular on a front face, in particular on a front panel, of the household appliance. The screen fixed relative to the appliance can be a touch-sensitive screen or touchscreen but is not restricted to such.

In one development the screen fixed relative to the appliance is configured at least visually in the same manner as the display field of the operating element. This can mean in particular that the display field of the operating element and the screen fixed relative to the appliance have the same resolution per unit of surface and/or the same color depth. This means that the display field and screen fixed relative to the appliance appear particularly uniform, clear and easy to read.

In one development the haptic operating element is a removable operating element and can be positioned or fastened in just one predefined position on the household appliance.

In one development, which is advantageous for a particularly versatile and conveniently variable arrangement, the haptic operating element can be positioned or fastened in a number of positions on the household appliance. This means that a user can select a preferred position for operating the household appliance for example. The content displayed in both displays (i.e. in the display field of the operating element and on the screen fixed relative to the appliance) can be tailored to the selected position of the haptic operating element. This can also be referred to as an adaptive display.

In one embodiment the household appliance has a control facility for operating the touch-sensitive display field and the screen fixed relative to the appliance. This allows the displays of the display field and the screen fixed relative to the appliance to be coordinated in a particularly simple manner. The control facility can be an operating module of the household appliance, which is linked for example to a central control facility of the household appliance. However the control facility can also be the central control facility.

In yet another embodiment the control facility is designed to set up or configure at least one virtual sensor surface or sensor key as an operating element of the household appliance on the touch-sensitive screen of the operating element. This allows particularly clearly structured, focused and context-related appliance operation. In one development the touch-sensitive screen has or provides a single sensor key. In another development the touch-sensitive screen has or provides a number of sensor keys.

In a further embodiment the at least one sensor key is the only operating element in at least one view of the display field and the screen fixed relative to the appliance. This provides a clear operating structure, which allows the user to operate the household appliance solely by way of the haptic operating element, at least in the displayed view. A view can refer in particular to a view of the display field and the screen fixed relative to the appliance associated with a specific point in a menu structure (menu view).

In particular if the screen fixed relative to the appliance is a touch-sensitive screen, in an alternative development it can also be used to operate the household appliance.

In a further embodiment the household appliance, in particular its control facility, is designed to coordinate a graphic appearance on the display field of the operating element with a graphic appearance of the screen fixed relative to the appliance. This results in a particularly clear, uniform display across both displays. This in turn results in a particularly clear and superior quality display, facilitating operability. Coordination can refer for example to function, content and/or graphic coordination, for example by means of supplementary functions and/or content as well as by means of a coordinated graphic display.

In a further embodiment the haptic operating element can be positioned on the household appliance in such a manner that it at least partially covers the screen fixed relative to the appliance. This can mean that only part of the haptic operating element covers the screen fixed relative to the appliance. In another development the haptic operating element can be positioned in its entirety on the screen fixed relative to the appliance.

In another embodiment the household appliance, in particular its control facility, is designed to coordinate a graphic appearance on the display field of the operating element with a graphic appearance of the sub-region of the screen fixed relative to the appliance, which is covered by the operating element. This has the advantage that the display field of the haptic operating element is perceived by the user as a part that is connected integrally to the screen fixed relative to the appliance.

In another embodiment the household appliance, in particular its control facility, is designed to display the sub-region of the screen fixed relative to the appliance, which is covered by the operating element, on the display field of the operating element. This produces the impression of a single, cohesive display on the two display units. In particular it prevents the operating element covering sub-regions of the display on the screen fixed relative to the appliance, thereby making them inaccessible for a user.

In one development the household appliance, in particular its control facility, is designed to display the covered sub-region of the screen fixed relative to the appliance on the display field of the operating element with a magnifying effect. This improves operator guidance and gives an impression of high quality.

In a further embodiment the household appliance, in particular its control facility, is designed to allow at least one graphic animation to run on the display field of the operating element. This allows the attention of a user to be diverted to the display field of the operating element. For example what is known as a coin flip animation can be used to switch in a visually effective manner between two functions that can be initiated by the touch-sensitive screen of the operating element. In one development the household appliance, in particular its control facility, is designed to allow the graphic animation to run in response to actuation of a sensor key of the operating element.

The properties, features and advantages of the present invention described above as well as the manner in which they are achieved will become clearer and more readily comprehensible in conjunction with the schematic description of an exemplary embodiment which follows and is explained in more detail in conjunction with the drawings.

DESCRIPTION OF THE INVENTION

Figure 1:
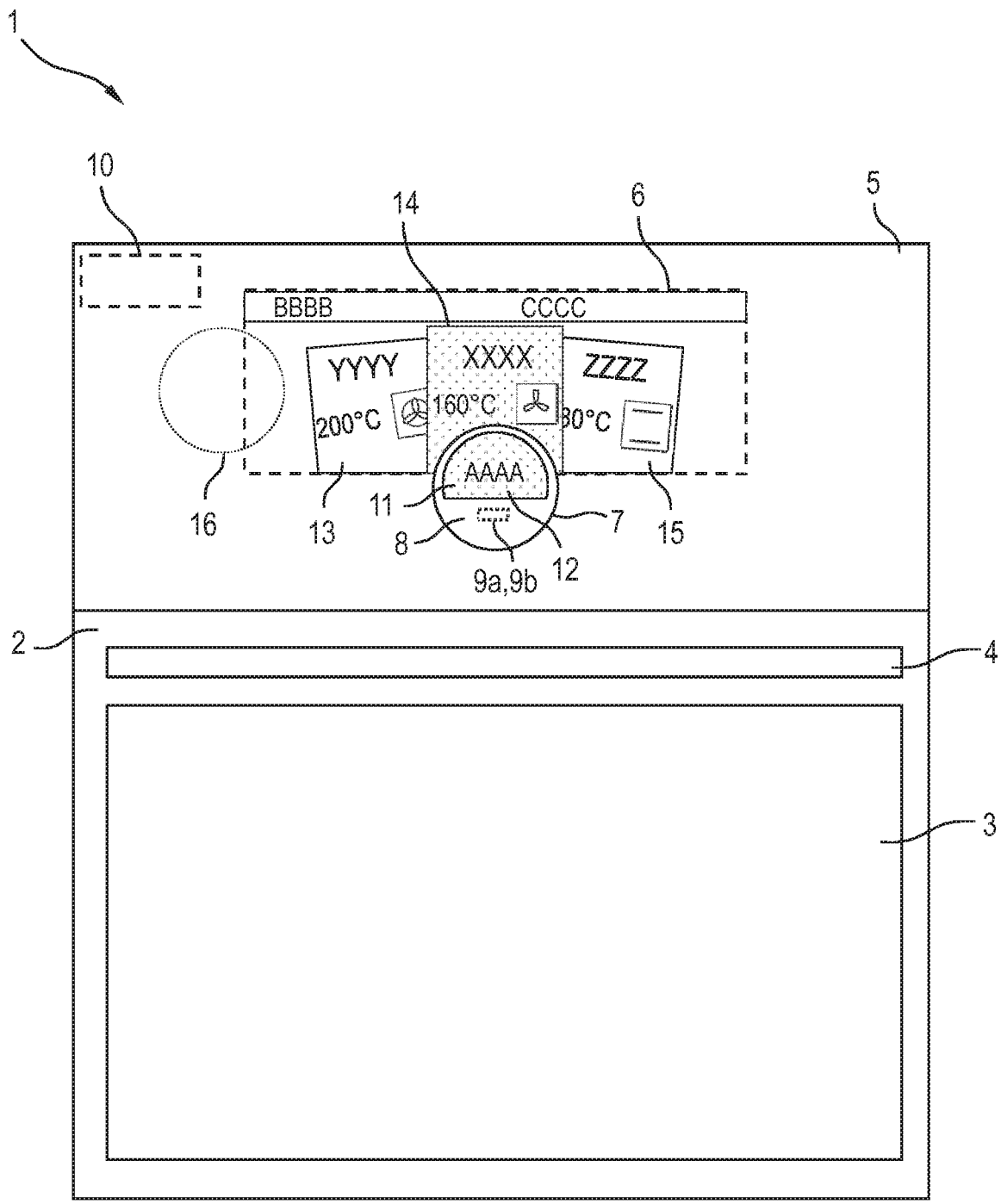
FIG. 1 shows a front view of a household appliance with a screen fixed relative to the appliance and a haptic operating element.

FIG. 1 shows a household appliance in the form of an oven 1. The oven 1 has an oven door 2 with a viewing window 3 and a door handle 4. Above the oven door 2 is an operating panel 5, into which a color screen 6 fixed relative to the appliance is let. The screen 6 can be a touchscreen. Further actuation elements, such as keys, in particular sensor keys, etc., can be present in the operating panel 5, for example an on/off switch (not shown). Alternatively the operating panel 5 can be integrated in the oven door 2.

The oven 1 also has a haptic operating element that can be positioned on the front in the form of a rotary knob 7, which can be fastened magnetically. The rotary knob 7 has a basic button shape or cylinder shape, a rear face serving as a bearing surface and a front face being visible to a user. A lateral surface serves as a grip surface for rotating the rotary knob 7. Part of the rotary knob 7 covers the screen 6 and the other part projects downward beyond the screen 6.

The rotary knob 7 has a touch-sensitive screen or touchscreen 8 on its front face. The touchscreen 8 takes up almost the entire front face and therefore corresponds to the entire visible display field.

The rotary knob 7 can have a data interface 9*a*, which transfers data wirelessly, with the oven 1. The data interface 9*a* can be a radio interface, an interface that transfers data inductively, etc. The rotary knob 7 can also have a data processing unit 9*b* (e.g. a microcontroller, ASIC, FPGA or another electronic unit) for exchanging data with the oven 1 by way of the data interface 9*a* and for operating the touchscreen 8.

The oven 1 also has a control facility 10 for operating the touchscreen 8 and the screen 6. The control facility 10 can be a central controller of the oven 1.

The oven 1 or its control facility 10 is designed to configure at least one—in this instance approximately semicircular—sensor surface or sensor key 11 virtually on the touchscreen 8 as an operating element of the oven 1. The remaining surface of the touchscreen 8 can be designed such that touching it does not initiate an action, in other words it is not configured as a sensor key. Alternatively the entire surface of the touchscreen 8 can be designed or configured as a sensor key.

The graphic embodiment of the touchscreen 8 is essentially arbitrary. Thus the surface assigned to the sensor key 11 can be a different color from the remaining surface of the touchscreen 8. The surface assigned to the sensor key 11 can also show lettering 12, for example according to "AAAA"="Start", "Set", "Pause", "Stop", etc. In principle a number of sensor keys (not shown) can be configured on the touchscreen 8. In the menu view shown here the sensor key 11 is the only actuation element configured on the screen 6 and touchscreen 8.

In the menu view shown the graphic displayed on the touchscreen 8 is coordinated with the graphic displayed on the screen 8. Regions replicated in a number of cards 13, 14, 15 for example are displayed on the screen 6, the cards 13 to 15 being arranged next to one another in the manner of a fan. A central card 14 is shown as standing out, with the adjacent cards 13 and 15 being shown arranged behind the central card 14 and being displayed as partially covered by it. Only the information assigned to the central card 14 is completely visible. For example, each of the cards 13 to 15 can display parameters for a specific cooking mode or cooking function, for example "XXXX"="Circo Therm", "YYYY"="Circo Therm Eco" and "ZZZZ"="Top heat and bottom heat". Each of the cards can also display a target cooking chamber temperature (e.g. 160° C., 180° C. or 200° C.) and associated heating mode symbol (e.g. hot air, circulating air, bottom and top heat, etc.). The background color of the central card 14 (e.g. red) is different from the background color of the cards 13 and 15 (e.g. white).

To coordinate with the screen 6 the background color of the sensor key 11 corresponds to the background color of the card 14. This graphically emphasizes the functional association of the sensor key 11 with the central card 14, specifically indicating that the function described by the lettering 12 of the sensor key 11 affects the cooking mode or cooking function displayed by the card 14. If for example a user presses the sensor key 11, when it shows the lettering 12 "Start", the cooking function "Circo Therm" described by the central card 14 is started with the previously set cooking chamber temperature of 160° C. and activation of the circulating fan. Parameters can be varied for example by rotating the rotary knob 7 with the "Set" function. This has the advantage that the user can perform both a selection function by rotating the rotary knob 7 and the frequently following key function at the rotary knob 7. The user therefore does not have to divert his/her attention away from the rotary knob 7 to look for a key.

The sensor key 11 color-coordinated with the card 14 gives the user the impression that the sensor key 11 shows at least approximately the sub-region of the screen 6 covered by the rotary knob 7. The sensor key 11 here projects visually downward slightly beyond the lower edge of the screen 6, giving an impression similar to that of the rotary knob 7 being used as a magnifier (magnifying effect).

The screen 6 can display further information above the cards 13 to 15, for example "BBBB"="Bake, "CCCC"=Cooking modes" and/or further symbols (not shown).

In one development the rotary knob 7 can be positioned so that it is attached magnetically for example to a left, right or upper side edge of the screen 6 as well as to the lower edge of the screen 6, as indicated by the ring 16. The oven 1 identifies the position of the rotary knob 7 automatically and reconfigures the graphic structure of the screen 6 and touchscreen 8 accordingly. For example the sensor field 11 can be displayed rotated through 90° clockwise if the rotary knob 7 is positioned on a side edge of the screen 6.

It is also possible to allow at least one graphic animation to run on the touchscreen 8, for example a coin flip animation. In the coin flip animation the sensor field can be circular in shape in a view not shown here and show the word "Start" for example, for example to start a cooking program or cooking mode. If the user actuates the sensor key, it contracts to a line in the vertical direction and then expands back to the circular shape. When it has expanded, a different word is shown, for example "Pause". This animation simulates the rotation of a disk or coin, with a different word on its two sides, thereby showing different functions for activation.

Figure 2:
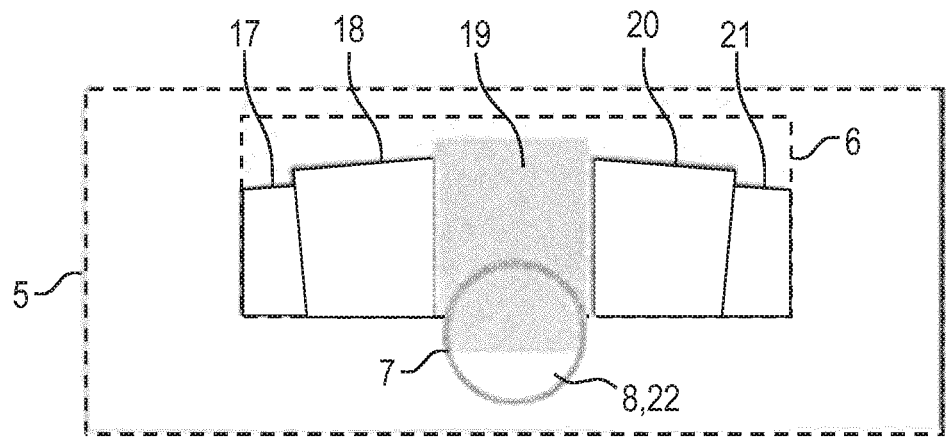
FIG. 2 shows a first front view of the screen fixed relative to the appliance and the haptic operating element.

FIG. 2 shows a first front view of the screen 6 fixed relative to the appliance and the rotary knob 7. This first view is similar to the view shown in FIG. 1 and shows five cards 17 to 21 in a fan-type arrangement on the screen 6 fixed relative to the appliance. The central card 19 is in the foreground. The touchscreen 8 shows a magnified view of a lower region of the central card 19. By pressing the sensor key configured on the touchscreen 8—in this instance a sensor key 22 taking up the entire touchscreen 8—it is possible to initiate the function(s) allocated to the central card 19 as in FIG. 1.

Figure 3:
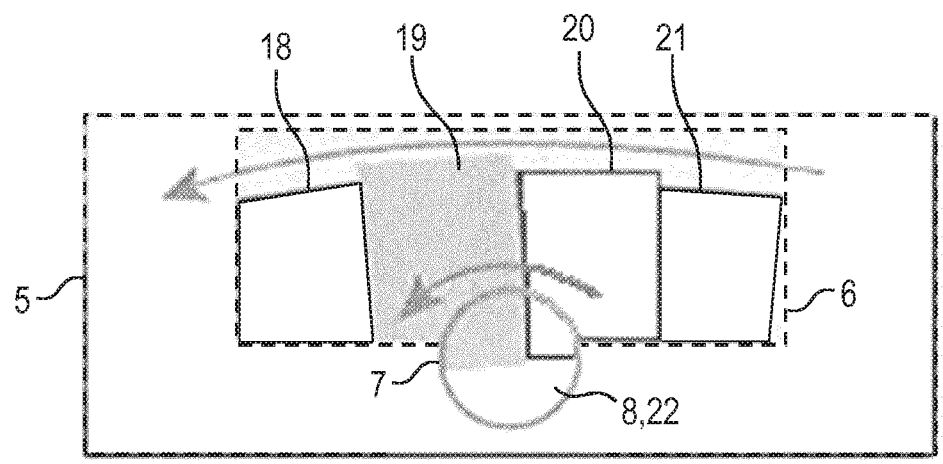
FIG. 3 shows a second front view of the screen fixed relative to the appliance and the haptic operating element.

FIG. 3 shows a second front view of the screen 6 fixed relative to the appliance and the rotary knob 7. In this second view the cards 17 to 21 are rotated through the screen 6 in sequence (as shown by the short curved arrow) by rotating the rotary knob 7 (as shown by the short curved arrow). The display on the touchscreen 8 also changes as the cards 17 to 21 are shown rotating.

The present invention is of course not restricted to the illustrated exemplary embodiment.

The panel can be dispensed with and the screen fixed relative to the appliance can be arranged in the door.

Generally "one" can refer to a single one or a number, particularly in the sense of "at least one" or "one or more", etc., unless this is specifically excluded, for example by the expression "just one", etc.

A cited number can also refer to just the cited number or a standard tolerance range, unless this is specifically excluded.

LIST OF REFERENCE CHARACTERS

1 Oven
2 Oven door
3 Viewing window
4 Door handle
5 Panel
6 Screen
7 Rotary knob
8 Touchscreen
9a Data interface
9b Data processing unit
10 Control facility
11 Sensor key
12 Lettering
13 Card
14 Card
15 Card
16 Ring
17 Card
18 Card
19 Card
20 Card
21 Card
22 Sensor key

The invention claimed is:

1. A household appliance, comprising:
a screen fixed relative to the appliance;
at least one haptic operating element including a display field configured at least partially as a touch-sensitive screen, said operating element configured to be positioned on the household appliance to at least partially cover said screen fixed relative to the appliance; and
a control facility for operating said display field of said operating element and said screen fixed relative to the appliance, said control facility configured to coordinate a graphic appearance on said display field of said operating element with a graphic appearance of a sub-region of said screen fixed relative to the appliance being covered by said operating element.

2. The household appliance according to claim 1, wherein said operating element of the household appliance is at least one sensor key disposed on said touch-sensitive screen of said operating element, and said control facility is constructed to configure said at least one sensor key.

3. The household appliance according to claim 2, wherein said at least one sensor key is the only operating element in at least one view of said display field and said screen fixed relative to the appliance.

4. The household appliance according to claim 1, wherein said control facility is configured to coordinate a graphic appearance on said display field of said operating element with a graphic appearance of said screen fixed relative to the appliance.

5. The household appliance according to claim 1, wherein said control facility is configured to display said sub-region of said screen fixed relative to the appliance being covered by said operating element on said display field of said operating element.

6. The household appliance according to claim 1, wherein said control facility is configured to display said sub-region of said screen fixed relative to the appliance being covered by said operating element on said display field of said operating element with a magnifying effect.

7. The household appliance according to claim 1, wherein said control facility is configured to allow at least one graphic animation to run on said display field of said operating element.

* * * * *